US012772754B2

(12) United States Patent
Lee et al.

(10) Patent No.: US 12,772,754 B2
(45) Date of Patent: Oct. 20, 2026

(54) METHOD TO REDUCE BENDING OF FEATURES ON A SURFACE OF A SUBSTRATE AND STRUCTURE FORMED USING SAME

(71) Applicant: ASM IP Holding B.V., Almere (NL)

(72) Inventors: Jaebeom Lee, Tempe, AZ (US); Charith Eranga Nanayakkara, Tempe, AZ (US); Roghayyeh Lotfi, Scottsdale, AZ (US); Paul Ma, Scottsdale, AZ (US)

(73) Assignee: ASM IP Holding B.V., Almere (NL)

( * ) Notice: Subject to any disclaimer, the term of this patent is extended or adjusted under 35 U.S.C. 154(b) by 789 days.

(21) Appl. No.: 18/135,799

(22) Filed: Apr. 18, 2023

(65) Prior Publication Data

US 2023/0343596 A1 Oct. 26, 2023

Related U.S. Application Data

(60) Provisional application No. 63/333,400, filed on Apr. 21, 2022.

(51) Int. Cl.
*H10P 14/40* (2026.01)
*H10W 20/00* (2026.01)

(52) U.S. Cl.
CPC ......... *H10P 14/418* (2026.01); *H10W 20/056* (2026.01)

(58) Field of Classification Search
CPC .... H10P 14/418; H10P 14/432; H10P 14/412; H10P 14/6339; H10W 20/056; H10W 20/033; H10W 20/425; H10W 20/045
See application file for complete search history.

(56) References Cited

U.S. PATENT DOCUMENTS

| | | | |
|---|---|---|---|
| 5,681,761 | A | 10/1997 | Kim |
| 5,935,648 | A | 8/1999 | Roberson et al. |
| 6,114,242 | A | 9/2000 | Sun et al. |
| 6,359,160 | B1 | 3/2002 | Sun et al. |
| 9,349,637 | B2 | 5/2016 | Na |
| 9,842,835 | B1 | 12/2017 | Cheng |
| 10,450,647 | B2 | 10/2019 | Sykora et al. |
| 10,714,579 | B2 | 7/2020 | Lee et al. |

(Continued)

FOREIGN PATENT DOCUMENTS

| | | | |
|---|---|---|---|
| FR | 2988219 | A1 | 9/2013 |
| JP | 2020029618 | A | 2/2020 |

(Continued)

OTHER PUBLICATIONS

Petra Alen, "Atomic layer deposition of molybdenum nitride thin films for cu metallizations", Journal of The Electrochemical Society, 152 (5) G361-G366 (2005) (Year:2005).

*Primary Examiner* — John M Parker
(74) *Attorney, Agent, or Firm* — Snell & Wilmer L.L.P.

(57) ABSTRACT

Methods for forming structures with reduced feature (e.g., line) bending are provided. Exemplary methods include using a cyclic deposition process, forming a layer comprising one or more of molybdenum, tungsten, and ruthenium, and providing a nitrogen-containing reactant to the reaction chamber to form a transient surface species. Use of the nitrogen-containing reactant is thought to mitigate metal interactions that are thought to contribute to feature bending.

20 Claims, 7 Drawing Sheets

(56) References Cited

U.S. PATENT DOCUMENTS

| | | | | |
|---|---|---|---|---|
| 10,734,497 | B2 | 8/2020 | Zhu | |
| 11,286,558 | B2 | 3/2022 | Stevens et al. | |
| 11,295,980 | B2 | 4/2022 | Zope et al. | |
| 11,521,851 | B2 | 12/2022 | Shero | |
| 11,581,220 | B2 | 2/2023 | Zope | |
| 2007/0026654 | A1 | 2/2007 | Huotari | |
| 2011/0031562 | A1 | 2/2011 | Lin | |
| 2017/0062224 | A1* | 3/2017 | Fu | H10P 14/432 |
| 2018/0053660 | A1 | 2/2018 | Jandl | |
| 2018/0135164 | A1 | 5/2018 | Karner et al. | |
| 2018/0294187 | A1* | 10/2018 | Thombare | H10P 14/432 |
| 2019/0027573 | A1 | 1/2019 | Zhu | |
| 2019/0067003 | A1 | 2/2019 | Zope | |
| 2019/0067014 | A1* | 2/2019 | Shrestha | C23C 16/045 |
| 2019/0067094 | A1* | 2/2019 | Zope | C23C 16/0272 |
| 2019/0393156 | A1* | 12/2019 | Zierath | C22C 19/00 |
| 2021/0180184 | A1 | 6/2021 | Alessio Verni | |
| 2021/0327715 | A1 | 10/2021 | Xie | |
| 2022/0278108 | A1* | 9/2022 | Yang | H10B 12/488 |
| 2022/0356197 | A1* | 11/2022 | Barik | C07F 11/00 |

FOREIGN PATENT DOCUMENTS

| | | | |
|---|---|---|---|
| KR | 20210024418 | A | 3/2021 |
| WO | 2010114386 | A1 | 10/2010 |
| WO | 2022005907 | A1 | 1/2022 |

* cited by examiner

METHOD TO REDUCE BENDING OF FEATURES ON A SURFACE OF A SUBSTRATE AND STRUCTURE FORMED USING SAME

CROSS-REFERENCE TO RELATED APPLICATIONS

This application is a nonprovisional of, and claims priority to and the benefit of, U.S. Provisional Patent Application No. 63/333,400, filed Apr. 21, 2022 and entitled "METHOD TO REDUCE BENDING OF FEATURES ON A SURFACE OF A SUBSTRATE AND STRUCTURE FORMED USING SAME," which is hereby incorporated by reference herein.

FIELD OF DISCLOSURE

The present disclosure relates generally to methods for forming structures suitable for the formation of electronic devices. More particularly, the disclosure relates to methods of forming deposited material between features on a surface of a substrate and to structures formed using the methods.

BACKGROUND OF THE DISCLOSURE

The scaling of electronic devices, such as semiconductor devices, has led to significant improvements in performance and density of integrated circuits. However, conventional device scaling techniques face significant challenges for future technology nodes.

For example, one challenge has been finding suitable conducting materials for use for metal gap fill applications, liner applications, and the like that exhibit desired properties, such as desired effective resistivity, low deposition temperature, and/or property (e.g., film stress) tunability. Another challenge has been developing suitable deposition techniques for such conducting materials that do not deleteriously affect underlying features on a surface of a substrate.

Recently, use of molybdenum for such applications has gained interest. For example, molybdenum has been suggested as a metal to fill regions between features, such as regions formed during the formation of buried word lines. While use of molybdenum may be desirable for various reasons, use of molybdenum to fill regions between features can be problematic, because deposition of molybdenum using typical deposition processes can cause the features to bend or warp during the deposition process. Such bending can become increasingly problematic as aspect ratios of the features increases and/or as a width of the features decreases. Accordingly, improved methods for depositing material are desired.

Any discussion, including discussion of problems and solutions, set forth in this section has been included in this disclosure solely for the purpose of providing a context for the present disclosure. Such discussion should not be taken as an admission that any or all of the information was known at the time the invention was made or otherwise constitutes prior art.

SUMMARY OF THE DISCLOSURE

This summary is provided to introduce a selection of concepts in a simplified form. These concepts are described in further detail in the detailed description of example embodiments of the disclosure below. This summary is not intended to necessarily identify key features or essential features of the claimed subject matter, nor is it intended to be used to limit the scope of the claimed subject matter.

Various embodiments of the present disclosure relate to methods of forming structures including layers, to structures formed using such methods, and to systems for performing the methods and/or for forming the structures. The layers can be used in a variety of applications, including gap fill (e.g., for complementary metal oxide semiconductor (CMOS)) applications, for use as a liner or barrier layer (e.g., for 2D-NAND or DRAM word-line) applications, for interconnect applications, and the like. Further, as set forth in more detail below, examples of the disclosure can be used to deposit layers overlying features, while mitigating bending of the features that may otherwise result using other techniques to deposit the layers.

In accordance with exemplary embodiments of the disclosure, a method to reduce bending of features on a surface of a substrate is provided. An exemplary method includes providing a substrate within a reaction chamber; using a cyclic deposition process, forming a layer comprising one or more of molybdenum, tungsten, and ruthenium; providing a nitrogen-containing reactant to the reaction chamber to form a transient surface species; and repeating the step of using the cyclic deposition process. The method can further include repeating the step of providing the nitrogen-containing reactant after the step of repeating the step of using the cyclic deposition process. The cyclic deposition process can include providing a metal precursor comprising one or more of molybdenum, tungsten, and ruthenium to the reaction chamber and providing a reducing reactant to the reaction chamber. The method can also include a step of forming a nucleation layer. The nucleation layer can include, for example, one or more of a molybdenum nitride, a tungsten nitride, and a ruthenium nitride. In accordance with examples of the disclosure, one or both of the steps of forming the nucleation layer and forming a layer comprising one or more of molybdenum, tungsten, and ruthenium are a thermal process—i.e., the process does not include use of (e.g., plasma) excited species. In accordance with further examples, a temperature of the substrate during the cyclic deposition process is higher than a temperature during the step of forming the nucleation layer.

In accordance with further exemplary embodiments of the disclosure, a structure is provided. The structure can include a substrate comprising a plurality of features, wherein at least two features of the plurality of features are adjacent features and a metal fill between the adjacent features. The metal fill can include a plurality of layers formed according to the method described herein.

In accordance with yet additional examples of the disclosure, a system to perform a method as described herein and/or to form a structure or portion thereof, is disclosed.

These and other embodiments will become readily apparent to those skilled in the art from the following detailed description of certain embodiments having reference to the attached figures. The invention is not being limited to any particular embodiments disclosed.

BRIEF DESCRIPTION OF THE DRAWING FIGURES

A more complete understanding of the embodiments of the present disclosure may be derived by referring to the detailed description and claims when considered in connection with the following illustrative figures.

Figure 1:
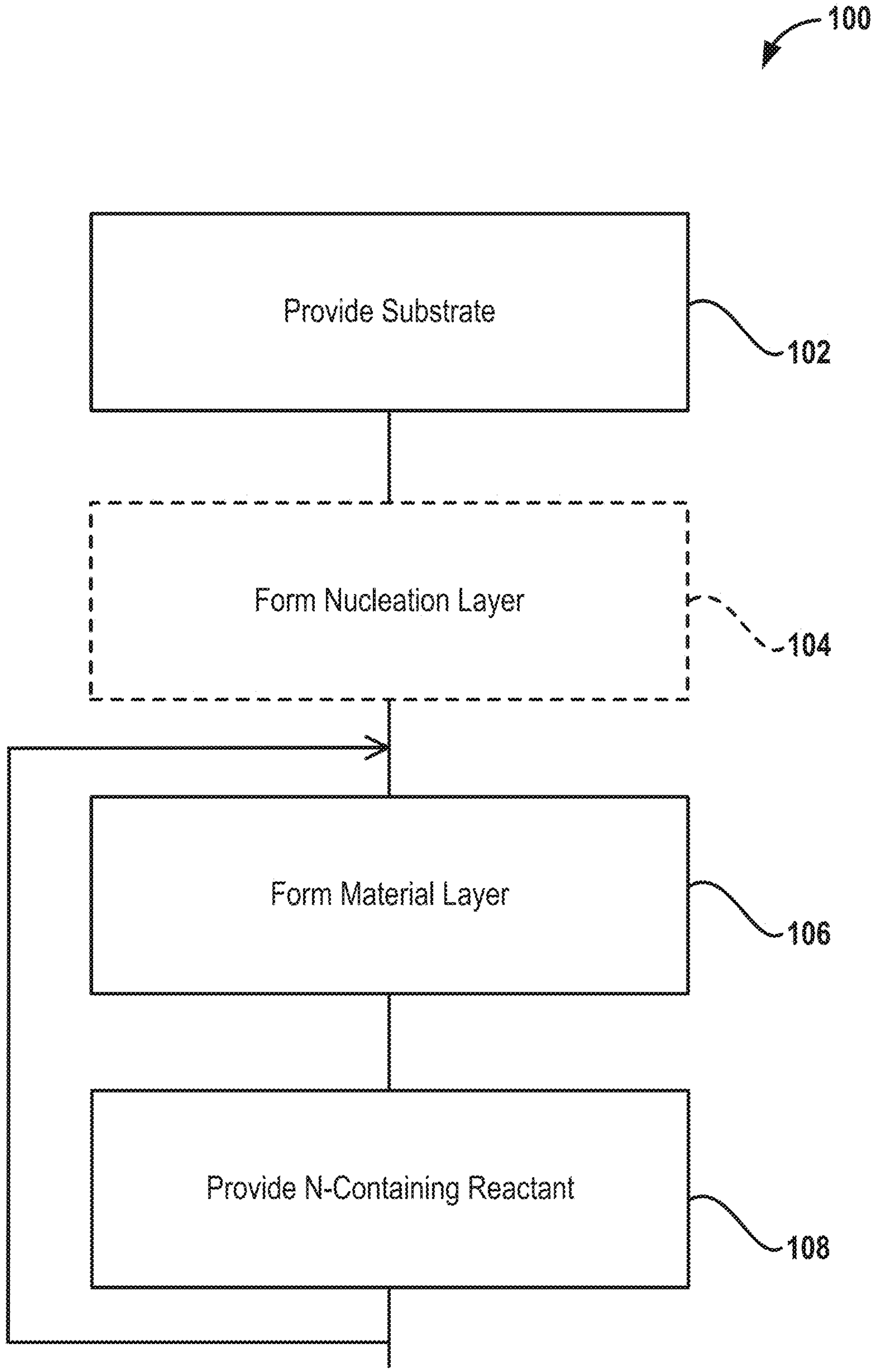
FIG. 1 illustrates a method in accordance with exemplary embodiments of the disclosure.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Moreover, recitation of multiple embodiments having stated features is not intended to exclude other embodiments having additional features or other embodiments incorporating different combinations of the stated features. For example, various embodiments are set forth as exemplary embodiments and may be recited in the dependent claims. Unless otherwise noted, the exemplary embodiments or components thereof may be combined in various combinations or may be applied separate from each other.

As set forth in more detail below, various embodiments of the disclosure provide methods for forming structures suitable for a variety of applications. Exemplary methods can be used to, for example, form layers suitable for gap fill applications, interconnect applications, barrier or liner applications, or the like. However, unless noted otherwise, the invention is not necessarily limited to such examples.

In this disclosure, gas can include material that is a gas at normal temperature and pressure (NTP), a vaporized solid and/or a vaporized liquid, and can be constituted by a single gas or a mixture of gases, depending on the context. A gas other than the process gas, i.e., a gas introduced without passing through a gas distribution assembly, other gas distribution device, or the like, can be used for, e.g., sealing the reaction space, and can include a seal gas, such as a rare gas. In some cases, the term "precursor" can refer to a compound that participates in the chemical reaction that produces another compound, and particularly to a compound that constitutes a film matrix or a main skeleton of a film; the term reactant can be used to refer to a gas that reacts with the precursor or derivative thereof to form a desired material. In some cases, the term reactant can be used interchangeably with the term precursor. The term inert gas can refer to a gas that does not take part in a chemical reaction and/or does not become a part of a film matrix to an appreciable extent. Exemplary inert gases include helium, argon, and any combination thereof.

As used herein, the term substrate can refer to any underlying material or materials that can be used to form, or upon which, a device, a circuit, or a film can be formed. A substrate can include a bulk material, such as silicon (e.g., single-crystal silicon), other Group IV materials, such as germanium, or other semiconductor materials, such as Group II-VI or Group III-V semiconductor materials, and can include one or more layers overlying or underlying the bulk material. Further, the substrate can include various features, such as recesses, protrusions, and the like formed within or on at least a portion of a layer of the substrate. By way of examples, a substrate can include bulk semiconductor material and an insulating or dielectric material layer overlying at least a portion of the bulk semiconductor material.

As used herein, the term film and/or layer can refer to any continuous or non-continuous structure and material, such as material deposited by the methods disclosed herein. For example, film and/or layer can include two-dimensional materials, three-dimensional materials, nanoparticles or even partial or full molecular layers or partial or full atomic layers or clusters of atoms and/or molecules. A film or layer may comprise material or a layer with pinholes, which may be at least partially continuous. In some cases, a metal fill includes a plurality of layers—e.g., multiple layers formed using a cyclical deposition process.

As used herein, a structure can be or include a substrate as described herein. Structures can include features and one or more layers overlying the features, such as one or more layers formed according to a method as described herein.

As used herein, the term cyclical deposition may refer to the sequential introduction of a precursor and a reactant into a reaction chamber to deposit a film over a substrate; the term cyclical deposition includes deposition techniques, such as atomic layer deposition and cyclical chemical vapor deposition.

As used herein, the term cyclical chemical vapor deposition may refer to any process wherein a substrate is sequentially exposed to a precursor and a reactant, which react and/or decompose on a substrate to deposit a desired film.

As used herein, the term atomic layer deposition (ALD) may refer to a vapor deposition process in which deposition cycles, preferably a plurality of consecutive deposition cycles, are conducted in a reaction chamber. Typically, during each deposition cycle, a precursor is chemisorbed to a deposition surface (e.g., a substrate surface or a previously deposited underlying surface, such as material from a previous ALD deposition cycle), forming a monolayer or sub-monolayer that does not readily react with additional precursor (i.e., a self-limiting reaction). Thereafter, a reactant (e.g., another precursor or reaction gas) may subsequently be introduced into the reaction chamber for use in converting the chemisorbed precursor to the desired material on the deposition surface. Typically, this reactant is capable of further reaction with the precursor.

As used herein, the term reducing agent may refer to a reactant that donates an electron to another species in a redox chemical reaction.

As used herein, the term bending or feature bending may refer to a bending or a distortion of features on a substrate. The bending or distortion can result from, for example, the deposition of a gap-fill material between adjacent features.

Figure 7:
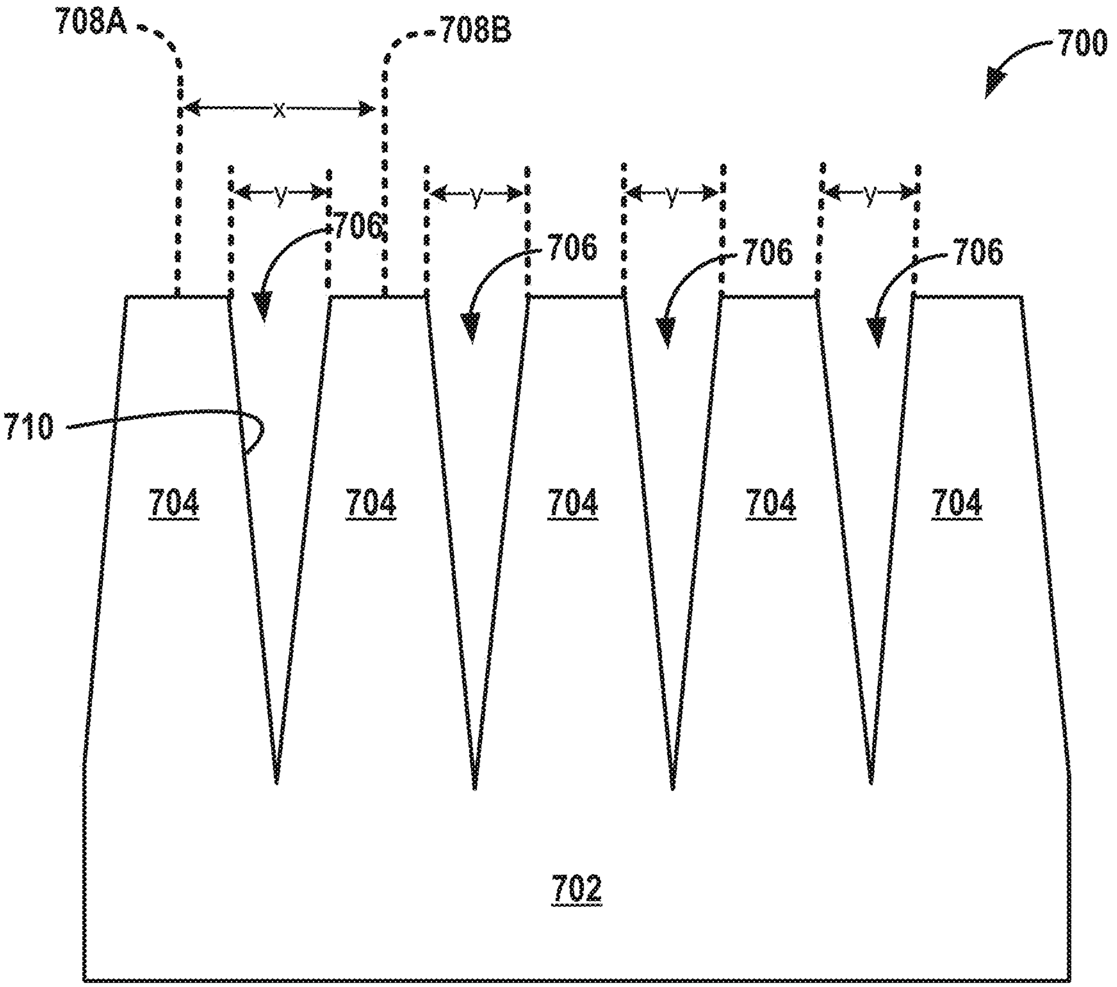
FIGS. 7 and 8 illustrate feature bending and measurements of feature bending.

FIG. 7 illustrates a simplified cross-sectional schematic diagram of a structure 700 prior to a gap-fill process. Structure 700 includes a substrate 702 including a plurality of features 704. Disposed between each of the adjacent features 704 is a corresponding gap 706. The plurality of features 704 may have a substantially regular pitch (x), wherein the pitch (x) may be defined as the distance between the middle vertical axis of one feature (e.g., axis 708A) to the middle vertical axis of an adjacent feature (e.g., axis 708B). Gaps 706, as illustrated in FIG. 7, include (e.g., sloped) sidewalls 710, wherein a cross-sectional width of each gap, may, for example, decrease from the top/opening of the gap down to the base of the gap. A width (y) of each gap 706 may be determined by measurement of the distance between opposing sidewalls of the gap. For example, in structure 700, vertical gaps 706 include v-shaped vertical trenches wherein the width (y) of each of the v-shaped trenches may be determined by measuring the distance between the uppermost extent of opposing sidewalls 710.

As a non-limiting example, structure 700 may comprise a portion of a partially fabricated dynamic random-access memory (DRAM) device structure prior to the deposition of a gap-fill film, wherein the partially fabricated DRAM device structure includes a regular array of buried wordline (bWL) trenches (e.g., vertical gaps or trenches 706).

Figure 8:
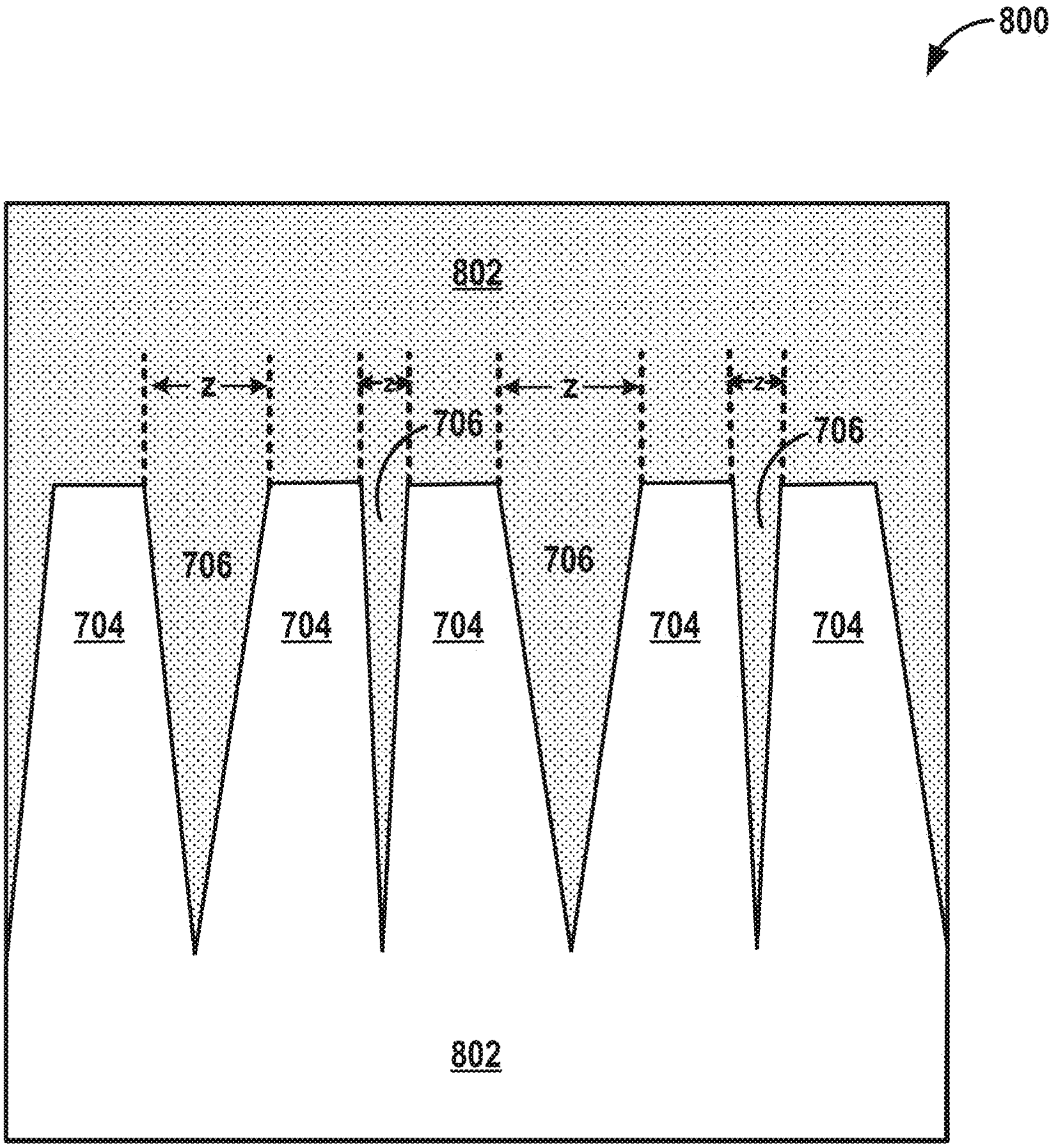

FIG. 8 illustrates a simplified cross-sectional schematic diagram of a structure 800 that includes the structure 700 following the deposition of a gap-fill material 802 overlying features 704. As illustrated in FIG. 8, features 704 disposed between adjacent gaps 806 are bent (or distorted) due to the deposition of the gap-fill film 802. The bending of the features 704 results in an increased variation of the width of gaps 806 as denoted by width (z), e.g., as measured at the uppermost extent of the v-shaped vertical trenches of FIG. 6.

As used herein, the term "percentage feature bending" may quantify the degree of feature bending caused by the deposition of a gap-fill film on a substrate including a plurality of features. The percentage feature bending may be calculated by the following equation (I):

$$\text{percentage (\%) feature bending} = \left(\frac{\text{offset}}{\text{pitch}}\right) \times 100 \tag{I}$$

wherein the offset is calculated by the following equation (II):

$$\text{offset} = |\langle\ \rangle - \langle y \rangle| \tag{II}$$

or, in other words, the value of the offset equals the absolute value of the average width of the gaps post deposition (average value of (z)) minus the average width of the gaps pre gap-fill deposition (average value (y)). As a non-limiting example, the offset may be statistically established by measuring the width (y) of a plurality of gaps prior to deposition and subsequently measuring the width (z) for a plurality of gaps following the deposition. The average of (z) and the average of (y) may be determined utilizing high magnification microscopy techniques, such as scanning electron microscopy, for example.

A number of example materials are given throughout the embodiments of the current disclosure, and it should be noted that the chemical formulas given for each of the example materials should not be construed as limiting and that the exemplary materials given should not be limited by a given example stoichiometry.

The present disclosure includes methods to reduce bending of features on a surface of a substrate—e.g., during or as a result of depositing material overlying and/or between the features. Exemplary methods can be used for a variety of applications, such as, for example, low electrical resistivity metal gap-fill films, liner layers for 2D-NAND, DRAM word-line features, as an interconnect material in CMOS logic applications, and the like.

Turning now to FIG. 1, a method 100 in accordance with examples of the disclosure is illustrated. Method 100 includes the steps of providing a substrate within a reaction chamber (102), using a cyclic deposition process, forming a material layer (step 106), providing a nitrogen-containing reactant to the reaction chamber to form a transient surface species (step 108), and optionally forming a nucleation layer (step 104). As illustrated, steps 106 and 108 can be repeated—e.g., to fill a gap with the material.

During step 102, a substrate is provided within a reaction chamber. The substrate can include any substrate as described herein and can include a plurality of features, wherein at least two features of the plurality of features are adjacent features.

The reaction chamber used during step 102 can be or include a reaction chamber of a chemical vapor deposition reactor system configured to perform a cyclical deposition process. The reaction chamber can be a standalone reaction chamber or part of a cluster tool.

Step 102 can include heating the substrate to a desired deposition temperature within the reaction chamber. In some embodiments of the disclosure, step 102 includes heating the substrate to a temperature of less than 800° C. For example, in some embodiments of the disclosure, heating the substrate to a deposition temperature may comprise heating the substrate to a temperature between approximately 20° C. and approximately 800° C., less than 650° C., less than 600° C., less than 550° C., less than 500° C., between about 200° C. and 600° C., between about 200° C. and 650° C., between about 200° C. and 550° C., between about 200° C. and 500° C., or between about 200° C. and 450° C. In some cases, the temperature of the substrate during step 102 and/or step 104 is less than the temperature of the substrate during step 106.

In addition to controlling the temperature of the substrate, a pressure within the reaction chamber may also be regulated. For example, in some embodiments of the disclosure, the pressure within the reaction chamber during step 102 may be less than 760 Torr or between about 0.2 and about 200 Ton, about 0.5 and about 50 Torr, or about 0.5 and about 20 Torr.

During step 104, a nucleation layer can be formed. The nucleation films may, for example, improve the quality of subsequently deposited material of films, and/or facilitate growth of the overlying film. The improved characteristics of the films formed according to the embodiments of the disclosure may result in improved metal gap-fill film and a reduction in the percentage feature bending in structures.

In some embodiments, the nucleation film may be deposited directly on an exposed surface of the substrate by one or more deposition processes, including, but not limited to, a chemical vapor deposition (CVD) process, a soak deposition process, a plasma-enhanced chemical vapor deposition (PECVD) process, or a physical vapor deposition (PVD) process. In particular embodiments of the disclosure, the nucleation film may be deposited employing a first cyclical deposition process. In accordance with further examples, the nucleation film may be deposited employing a thermal process (i.e., without use of plasma-activated species).

In some embodiments, the deposition temperature employed for the deposition of the nucleation film may be dependent on the composition of the nucleation film being deposited. For example, in some embodiments of the disclosure, the nucleation film may comprise a metal oxide nucleation film, including, but not limited to, an aluminum oxide nucleation film, a molybdenum oxide nucleation film, a tungsten oxide nucleation film, a ruthenium oxide nucleation film, a rhenium oxide nucleation film, or an iridium oxide nucleation film. In such example embodiments, the temperature of the substrate during deposition of the metal oxide nucleation film may be less than approximately 800° C., or less than approximately 600° C., or less than approximately 500° C., or less than approximately 450° C., or less than approximately 400° C., or even less than approximately 300° C. In some embodiments, the temperature of the substrate during the deposition of the metal oxide nucleation film may be between 250° C. and 550° C.

In some embodiments, the nucleation film may comprise a metal nitride nucleation film. For example, the metal nitride nucleation film may comprise a molybdenum nitride, a tungsten nitride, or a ruthenium nitride film. In such example embodiments, the temperature of the substrate during deposition of the molybdenum nitride nucleation film may be less than approximately 700° C., or less than approximately 600° C., or less than approximately 500° C., or less than approximately 400° C., or less than approximately 200° C., or even less than 200° C. In some embodiments, the temperature of the substrate during the deposition of the metal nitride nucleation film is between 200° C. and 700° C., or between 250° C. and 600° C., or even between 450° C. and 550° C.

Once the substrate has been heated to a desired temperature and the pressure within the reaction chamber has been regulated to a desired level, method 100 may continue by means of a first cyclical deposition phase which may comprise an atomic layer deposition (ALD) process, or cyclical chemical vapor deposition (CCVD) process to form a nucleation layer (step 104).

Figure 2:
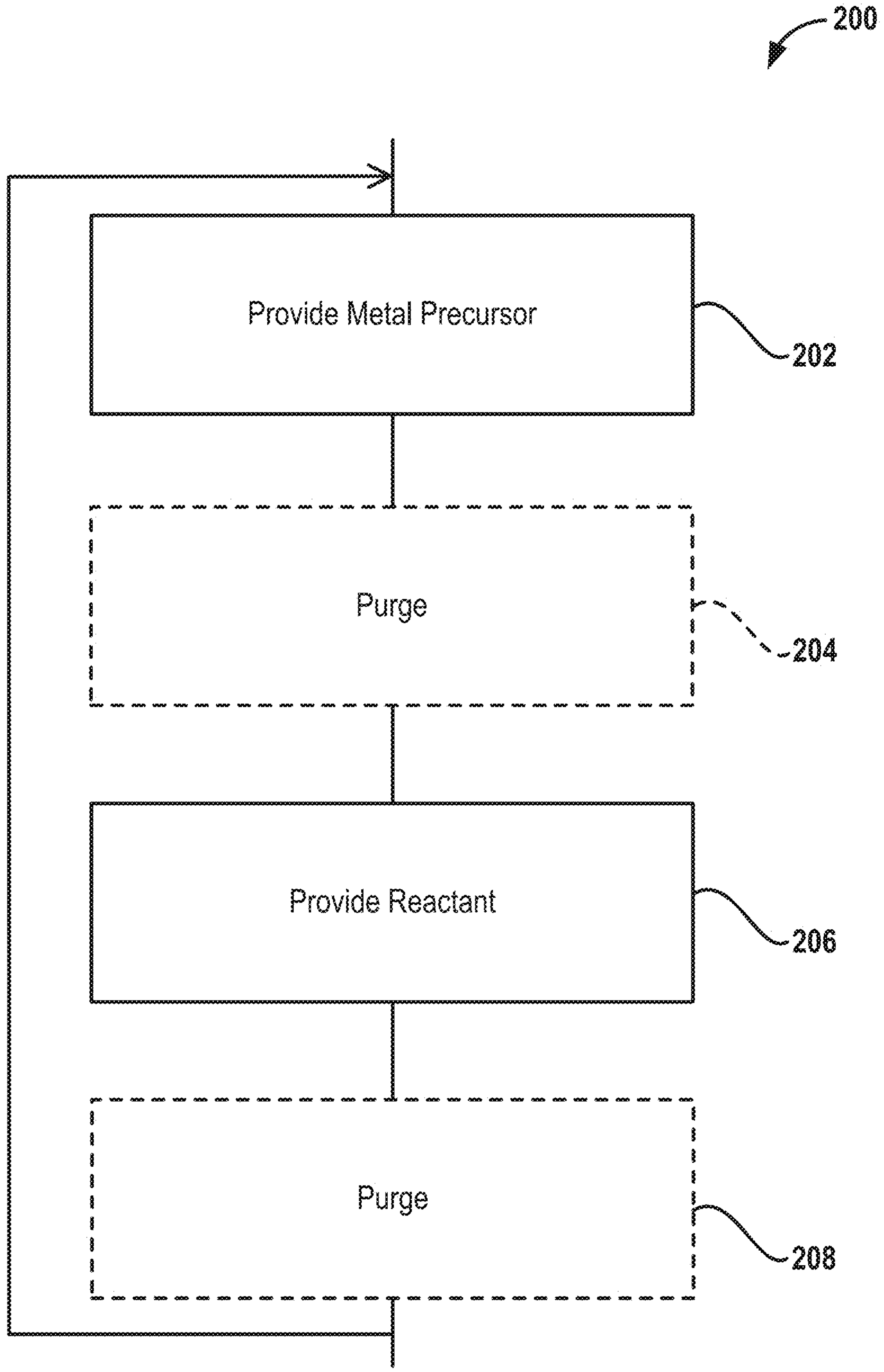
FIG. 2 illustrates a process in accordance with exemplary embodiments of the disclosure.

FIG. 2 illustrates a process 200 suitable for forming a nucleation layer suitable for step 104. Process 200 includes providing a metal precursor (step 202), optionally purging the reaction chamber (step 204), providing a reactant (step 206), and optionally purging (step 208).

During step 202, a metal precursor is provided to the reaction chamber. The metal precursor can include, for example, one or more of an aluminum precursor, a tungsten precursor, a ruthenium precursor, a rhenium precursor, an iridium precursor, and a molybdenum precursor.

Exemplary aluminum precursors include at least one of: trimethylaluminum (TMA), triethylaluminum (TEA), dimethylaluminumhydride (DMAH), tritertbutylaluminum (TTBA), aluminum trichloride ($AlCl_2$), or dimethylaluminumisopropoxide (DMAI).

Exemplary tungsten precursors include a metalorganic tungsten precursor. In some embodiments, the metalorganic tungsten precursor may comprise cyclopentadienyl compounds of tungsten, tungsten betadiketonate compounds, tungsten alkylamine compounds, tungsten amidinate compounds, or other metalorganic tungsten compounds. In some embodiments, the metalorganic tungsten precursor may comprise bis(tert-butylimino)bis(tertbutylamino)tungsten (VI), bis(isopropylcyclopentadienyl)tungsten(IV)dihydride, or tetracarbonyl(1,5-cyclooctadiene)tungsten(0).

Exemplary ruthenium precursors include at least one of: ruthenium tetraoxide ($RuO_4$), Bis(cyclopentadienyl)ruthenium(II), Bis(ethylcyclopentadienyl)ruthenium(II), and triruthenium.

Exemplary rhenium precursors include at least one of a rhenium halide precursor, a rhenium oxyhalide precursor, an alkyl rhenium oxide precursor, a cyclopentadienyl based rhenium precursor, or a rhenium carbonyl halide precursor. Further information relating to rhenium precursors is described in U.S. patent application Ser. No. 16/219,555, entitled "Methods for forming a rhenium-containing film on a substrate by a cyclical deposition process and related semiconductor device structure," the entire contents of which is incorporated by reference herein.

Exemplary iridium precursors include at least one of: 1,5-cyclooctadiene(acetylacetonato)iridium(I), 1,5-cyclooctadiene(hexafluoroacetylacetonato)iridium(I), 1-ethylcyclopentadienyl-1,2-cyclohexadieneiridium(I), iridium(II)acetylacetonate, (methylcyclopentadienyl)(1,5-cyclooctadiene) iridium(I), and tris(norbornadiene)(acetylacetonato)iridium (III).

Exemplary molybdenum precursors include a molybdenum halide precursor. In some embodiments, the molybdenum halide precursor may comprise a molybdenum chloride precursor, a molybdenum iodide precursor, or a molybdenum bromide precursor. As non-limiting examples, the molybdenum halide precursor may comprise at least one of: molybdenum pentachloride ($MoCl_5$), molybdenum hexachloride ($MoCl_6$), molybdenum hexafluoride ($MoF_6$), molybdenum triiodide ($MoI_2$), or molybdenum dibromide ($MoBr_2$). In some embodiments, the molybdenum halide precursor may comprise a molybdenum chalcogenide, and in particular embodiments, the molybdenum halide precursor may comprise a molybdenum chalcogenide halide. For example, the molybdenum chalcogenide halide precursor may comprise a molybdenum oxyhalide selected from the group comprising: a molybdenum oxychloride, a molybdenum oxyiodide, or a molybdenum oxybromide. In particular embodiments of the disclosure, the molybdenum halide precursor may comprise a molybdenum oxychloride, including, but not limited to, molybdenum (V) trichloride oxide ($MoOCl_2$), molybdenum (VI) tetrachloride oxide ($MoOCl_4$), or molybdenum (IV) dichloride dioxide ($MoO_2Cl_2$). Additionally or alternatively, the molybdenum precursor may comprise a metalorganic molybdenum precursor, such as, for example, $Mo(CO)_6$, $Mo(tBuN)_2(NMe2)_2$, $Mo(NBu)_2(StBu)_2$, $(Me_2N)_4Mo$, and $(iPrCp)_2MoH_2$.

In some embodiments, step 202 may comprise a contact time period of between about 0.1 seconds and about 60 seconds, or between about 0.1 seconds and about 10 seconds, or between about 0.5 seconds and about 5.0 seconds. In addition, during the contacting of the substrate with the metal precursor, the flow rate of the metal precursor may be less than 1000 sccm, or less than 500 sccm, or less than 100 sccm, or less than 10 sccm, or even less than 1 sccm. In addition, during the contacting of substrate with the metal precursor, the flow rate of the metal precursor may range from about 1 to 2000 sccm, from about 5 to 1000 sccm, or from about 10 to about 500 sccm.

Purge step 204 may comprise a purge cycle wherein the substrate surface is purged for a time period of less than approximately 5.0 seconds, or less than approximately 2.0 seconds, or even less than approximately 1 second Excess metal precursor and any possible reaction byproducts may be removed with the aid of a vacuum, generated by a pumping system in fluid communication with the reaction chamber.

During step 206, a reactant is provided to the reaction chamber. The reactant can include, for example, one or more of a nitrogen-containing reactant, an oxygen-containing reactant, a silicon-containing reactant, and a boron-containing reactant.

Exemplary oxygen-containing reactants can be selected from the group consisting of water ($H_2O$), hydrogen peroxide ($H_2O_2$), ozone ($O_2$), or oxides of nitrogen, such as, for example, nitrogen monoxide (NO), nitrous oxide ($N_2O$), or nitrogen dioxide ($NO_2$). As further non-limiting examples, the oxygen precursor may comprise: an organic alcohol, such as, for example, isopropyl alcohol, or an oxygen plasma, wherein the oxygen plasma may comprise: atomic oxygen, oxygen radicals, and excited oxygen species.

Exemplary oxygen-containing reactants can be selected from the group consisting of ammonia ($NH_2$), hydrazine ($N_2H_4$), triazane ($N_2H_5$), tertbutylhydrazine ($C_4H_9N_2H_2$), methylhydrazine ($CH_2NHNH_2$), dimethylhydrazine (($CH_2$) $_2N_2H_2$), or a nitrogen plasma, wherein the nitrogen plasma includes: atomic nitrogen, nitrogen radicals, and excited nitrogen species.

Exemplary silicon-containing reactants can be selected from the group consisting of silane ($SiH_4$), disilane ($Si_2H_6$), trisilane ($Si_2H_8$), tetrasilane ($Si_4H_{10}$) or higher order silanes with the general empirical formula $Si_xH_{(2x+2)}$.

Exemplary boron-containing reactants can be selected from the group consisting of borane ($BH_2$), diborane ($B_2H_6$) ,or other boranes, such as decaborane ($B_{10}H_{14}$).

In some embodiments of the disclosure, a duration of step 206 can be between about 0.01 seconds and about 120 seconds, between about 0.05 seconds and about 60 seconds, or between about 0.1 seconds and about 10 seconds. In addition, during the contacting of the substrate with the second vapor phase reactant, the flow rate of the second vapor phase reactant may be less than 10000 sccm, or less than 5000 sccm, or even less than 100 sccm.

Upon completion of step 206, process 200 can proceed to step 208. During step 208, excess second vapor phase reactant and reaction byproducts (if any) may be removed from the surface of the substrate, as previously described herein. Process 200 can be repeated until a desired thickness is reached and/or until a number of cycles have been performed.

It should be appreciated that in some embodiments of the disclosure, the order of contacting the substrate with the metal precursor and reactant may be such that the substrate is first contacted with the reactant followed by the precursor or vice versa. In addition, in some embodiments, process 200 may comprise contacting the substrate with the reactant and/or precursor one or more times prior to proceeding to the next step.

In some embodiments of the disclosure, the nucleation film may be deposited directly on an exposed surface of the substrate at a growth rate from about 0.05 Å/cycle to about 5 Å/cycle, or from about 0.1 Å/cycle to about 2 Å/cycle.

In some embodiments of the disclosure, the nucleation film may be deposited as a physically continuous film. For example, the thickness at which a film becomes physically continuous may be determined utilizing low-energy ion scattering (LEIS). In some embodiments, a physically continuous nucleation film may be deposited to an average film thickness of less than 100 Å, or less than 50 Å, or less than 40 Å, or less than 30 Å, or less than 20 Å, or less than 10 Å, or even less than 5 Å. In some embodiments, a physically continuous nucleation film may be deposited to an average film thickness between approximately 5 Å and 50 Å.

In some embodiments of the disclosure, the nucleation film is deposited as a physically discontinuous film having an average film thickness of less than 50 Å, or less than 40 Å, or less than 30 Å, or less than 20 Å, or less than 10 Å, or less than 5 Å, or less than 2 Å, or even less than 1 Å. In some embodiments, the physically discontinuous nucleation film may be deposited to an average film thickness between approximately 1 Åand 50 Å.

In some embodiments of the disclosure, the nucleation film may be deposited as an amorphous film. For example, the nucleation film may comprise one of an amorphous metal oxide film or an amorphous metal nitride film.

Referring again to FIG. 1, once the nucleation layer is formed, a material layer is deposited during step 106. In accordance with examples of the disclosure, step 106 includes a cyclic deposition process to form a layer comprising one or more of molybdenum, tungsten, and ruthenium.

Figure 3:
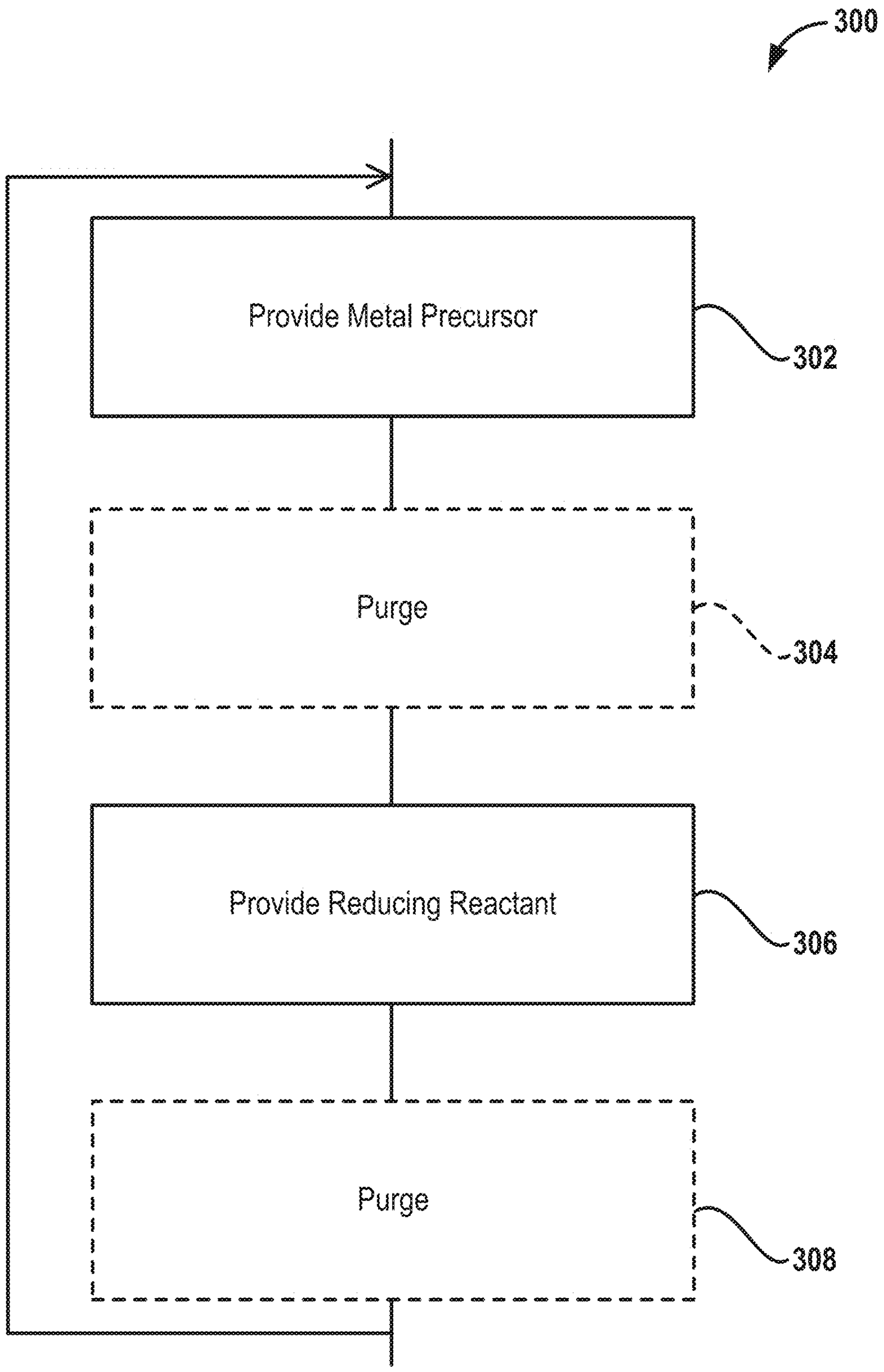
FIG. 3 illustrates another process in accordance with exemplary embodiments of the disclosure.

FIG. 3 illustrates a cyclical deposition process 300 to form a layer comprising one or more of molybdenum, tungsten, and ruthenium in accordance with examples of the disclosure. Process 300 is suitable for use as step 106. In the illustrated example, process 300 includes the step of providing a metal precursor (step 302), purging (step 304), providing a reducing reactant (step 306), and purging (step 308).

Process 300 may comprise an atomic layer deposition process or a cyclical chemical vapor deposition process, as previously described herein. As a non-limiting example, process 300 may include heating the substrate to a desired deposition temperature. For example, the substrate may be heated to a substrate temperature of less than approximately 800° C., or less than approximately 700° C., or less than approximately 600° C., or less than approximately 500° C., or less than approximately 400° C., or less than approximately 300° C., or even less than approximately 200° C. In some embodiments of the disclosure, the substrate temperature during process 300 may be between 200° C. and 800° C., or between 200° C. and 700° C., or between 400° C. and 600° C., or between 500° C. and 550° C., or between about 500° C. and about 600° C. The temperature during process 300 may be higher or the same as a temperature during process 200.

In addition to achieving a desired deposition temperature, i.e., a desired substrate temperature, the second cyclical deposition process 220 may also regulate the pressure within the reaction chamber during the deposition process to obtain desirable characteristics of the deposited material. For example, in some embodiments of the disclosure, the second cyclical deposition process 220 may be performed within a reaction chamber regulated to a pressure of less than 200 Torr, or less than 150 Torr, or less than 100 Torr, or less than 50 Torr, or less than 25 Torr, or even less than 10 Torr. In some embodiments, the pressure within the reaction chamber during deposition may be regulated at a pressure between 10 Torr and 200 Ton, or between 20 Torr and 80 Torr, or even equal to or greater than 20 Torr.

Upon heating the substrate to a desired deposition temperature and regulating the pressure within the reaction chamber, process 300 can proceed to step 302. Step 302 includes providing a metal precursor to a reaction chamber. The metal precursor can be or include one or more of molybdenum, tungsten, and ruthenium. The molybdenum, tungsten, and ruthenium precursors can include any of the respective precursors noted above.

In some embodiments of the disclosure, a duration of step 302 can be between about 0.1 seconds and about 60 seconds, or between about 0.1 seconds and about 10 seconds, or between about 0.5 seconds and about 5.0 seconds, or greater than zero seconds and less than one second. In addition, during the contacting of the substrate with the molybdenum halide precursor, the flow rate of the metal precursor may be less than 1000 sccm, or less than 500 sccm, or less than 100 sccm, or less than 10 sccm, or even less than 1 sccm or may range from about 1 to 2000 sccm, from about 5 to 1000 sccm, or from about 10 to about 500 sccm. above.

Steps 304 and 308 can be the same or similar to steps 204 and 208 described Step 306 includes providing a reducing reactant to the reaction chamber.

Exemplary reducing reactants include, for example, at least one of: forming gas ($H_2$+$N_2$), ammonia ($NH_2$), hydrazine ($N_2H_4$), an alkyl-hydrazine (e.g., tertiary butyl hydrazine ($C_4H_{12}N_2$)), molecular hydrogen ($H_2$), hydrogen atoms (H), an alcohol, an aldehyde, a carboxylic acid, a borane, or an amine. In further examples, the reducing agent may comprise at least one of: silane ($SiH_4$), disilane ($Si_2H_6$), trisilane ($Si_2H_8$), germane ($GeH_4$), digermane ($Ge_2H_6$), borane ($BH_2$), or diborane ($B_2H_6$). In particular embodiments of the disclosure, the reducing agent may comprise molecular hydrogen ($H_2$).

A duration of step 306 can be between about 0.01 seconds and about 180 seconds, or between about 0.05 seconds and about 60 seconds, or between about 0.1 seconds and about 10.0 seconds, or is greater than zero seconds and less than 30 seconds or between about one second and about three seconds, or between about two seconds and about four seconds. In addition, during step 306, the flow rate of the reducing agent may be less than 20 slm, or less than 15 slm, or less than 10 slm, or less than 5 slm, or less than 1 slm, or even less than 0.1 slm. In addition, during the contacting of the substrate with the reducing agent, the flow rate of the reducing agent may range from about 0.1 to 20 slm, from about 5 to 15 slm, or be equal to or greater than 10 slm.

Similar to process 200, it should be appreciated that in some embodiments of the disclosure, the order of contacting of the substrate with the metal precursor and the reducing reactant may be such that the substrate is first contacted with the reducing reactant, followed by the metal precursor. In addition, in some embodiments, process 300 may comprise contacting the substrate with the metal precursor one or more times prior to contacting the substrate with the reducing reactant one or more times. In addition, in some embodiments, process 300 may comprise contacting the substrate with the reducing agent one or more times prior to contacting the substrate with the precursor one or more times. Process 300 can be repeated a number of times prior to proceeding to step 108. For example, the steps of providing the metal precursor and providing the reducing reactant can be repeated a number of times prior to the step of providing the nitrogen-containing reactant to the reaction chamber.

During step 108, a nitrogen-containing reactant is provided to the reaction chamber. The nitrogen-containing reactant is thought to form a transient surface species, which can mitigate feature (e.g., line) bending. Exemplary nitrogen-containing reactants suitable for use with step 108 include one or more of: molecular nitrogen ($N_2$), ammonia ($NH_3$), hydrazine ($N_2H_4$), a hydrazine derivative, or activated species formed therefrom (e.g., by forming a plasma using the nitrogen-containing reactant). In some embodiments, the hydrazine derivative may comprise an alkylhydrazine including at least one of: tertbutylhydrazine ($C_4H_9N_2H_3$), methylhydrazine ($CH_3NHNH_2$), 1,1-dimethylhydrazine ($(CH_3)_2N_2H_2$), 1,2-dimethylhydrazine, ethylhydrazine, 1,1-diethylhydrazine, 1-ethyl-1-methylhydrazine, isopropylhydrazine, phenylhydrazine, 1,1-diphenylhydrazine, 1,2-diphenylhydrazine, N-aminopiperidine, N-aminopyrrole, N-aminopyrrolidine, N-methyl-N-phenylhydrazine, 1-amino-1,2,3,4-tetrahydroquinoline, N-aminopiperazine, 1,1-dibenzylhydrazine, 1,2-dibenzylhydrazine, 1-ethyl-1-phenylhydrazine, 1-aminoazepane, 1-methyl-1-(m-tolyl)hydrazine, 1-ethyl-1-(p-tolyl)hydrazine, 1-aminoimidazole, 1-amino-2,6-dimethylpiperidine, N-aminoaziridine, or azo-tert-butane. In some embodiments, a nitrogen-based plasma may be generated by the application of RF power to form the nitrogen-based plasma that may comprise, for example, atomic nitrogen (N), nitrogen ions, nitrogen radicals, and other excited species of nitrogen. In some embodiments, the nitrogen based plasma may further comprise additional reactive species, such as by the addition of a further gas.

In some embodiments of the disclosure, a duration of step 108 can be between about 0.01 seconds and about 180 seconds, or between about 0.05 seconds and about 60 seconds, or even between about 0.1 seconds and about 10.0 seconds. In some embodiments, the substrate may be exposed to the nitrogen precursor for a time period of less than 60 seconds, or less than 30 seconds, or less than 15 seconds, or even less than 5 seconds. In some embodiments, the substrate may be exposed to the nitrogen precursor for a time period between 5 seconds and 60 seconds, or between 5 seconds and 30 seconds. In addition, during the contacting of the substrate with the nitrogen precursor, the flow rate of the nitrogen precursor may be less than 30 slm, or less than 15 slm, or less than 10 slm, or less than 5 slm, or less than 2 slm, or even less than 1 slm. In addition, during the contacting of the substrate with the nitrogen precursor, the flow rate of the nitrogen precursor may range from about 0.1 to 30 slm, from about 2 to 15 slm, or be equal to or greater than 2 slm.

A pressure and/or temperature within the reaction chamber during step 108 can be the same or similar to a temperature described above in connection with step 104 and/or 106.

As noted above, a disadvantage of current metal gap-fill processes and materials is the occurrence of line or feature bending, which may be observed, for example, in substrates having features with a narrow pitch, or having high aspect ratios. Significant feature bending has been observed in DRAM buried wordline structures (bWL) when employing conventional metal films, such as tungsten, as the gap-fill material for (bWL) trench structures. The presence of feature bending during device fabrication may result in undesirable device non-uniformity and a reduction in device yield. Replacing conventional gap-fill deposition processes and materials with the deposition processes and nucleation films/material films of the current disclosure may allow for the reduction, or even elimination, of feature bending during device fabrication.

Figure 4:
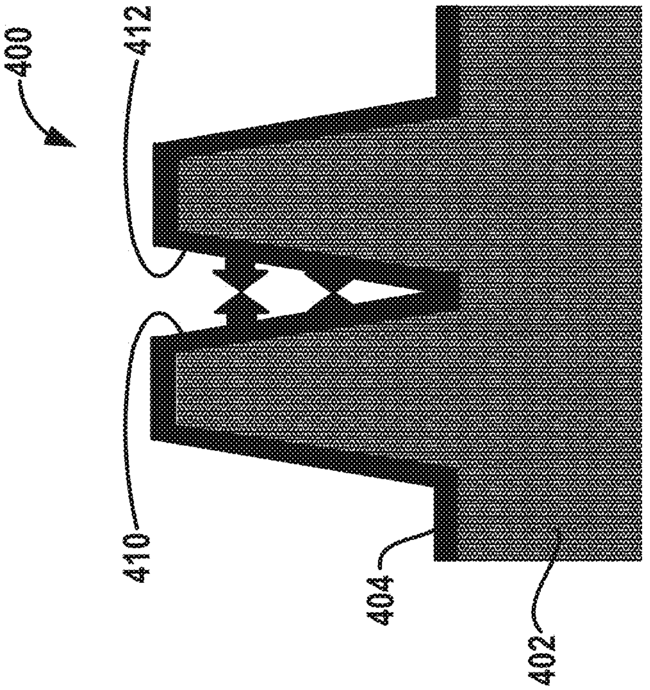
FIG. 4 illustrates a structure, illustrating interactions that can cause feature bending.

FIG. 4 illustrates a structure 400 including a substrate 402, features 406, and a material layer 404 (e.g., a molybdenum layer) formed overlying features 406 and within a gap 408. As illustrated, as the metal (e.g., molybdenum) begins to fill gap 408, metal interactions from material deposited on sidewalls 410, 412 can cause undesired feature bending as described above.

Figure 5:
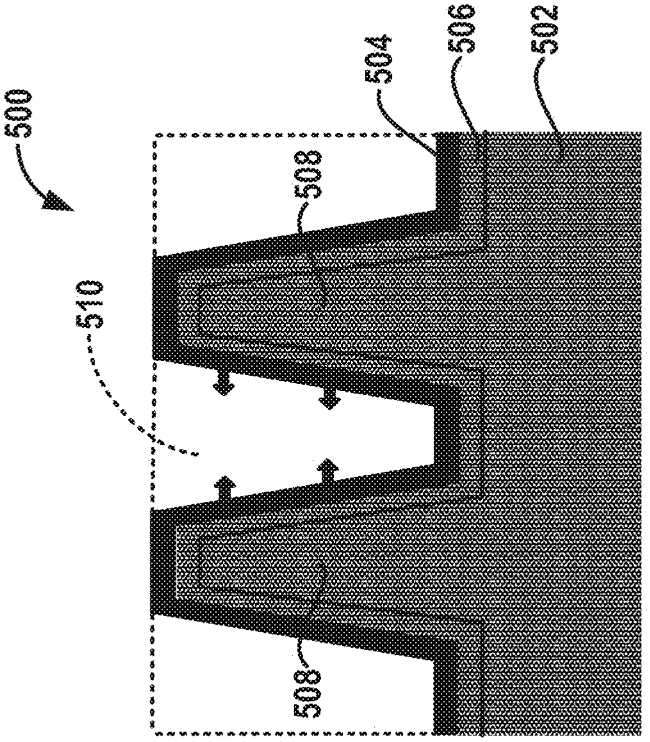
FIG. 5 illustrates a structure formed in accordance with the present disclosure, illustrating reduced feature bending.

FIG. 5 illustrates a structure 500 formed in accordance with examples of the disclosure, in which feature bending is reduced—compared to feature bending that results from typical deposition methods. Structure 500 includes a substrate 502, a nucleation layer 506, and one or more layers comprising one or more of molybdenum, tungsten, and ruthenium. Substrate 502 includes a plurality of features 508, wherein at least two features 508 of the plurality of features are adjacent features. Features 508 may have an aspect ratio (height:width) which may be greater than 2:1, or greater than 5:1, or greater than 10:1, or greater than 25:1, or greater than 50:1, or even greater than 100:1. In the example illustrated in FIG. 5, the width of the v-shaped vertical trenches may be determined by measurement of the distance between the uppermost extent of the opposing sidewalls of each v-shaped vertical trench.

Nucleation layer 506 can include one or more of a molybdenum nitride, a tungsten nitride, and a ruthenium nitride and/or other nucleation layer noted herein. A thickness of nucleation layer 506 can be greater than zero and less than 30 Angstroms, or between about 5 and 20 Angstroms, or be about 10 Angstroms.

In some embodiments, the reduction or elimination of feature bending resulting from the deposition processes and materials of the current disclosure may be quantified by determining the percentage feature bending, as described above.

In some embodiments, the percentage feature bending of a plurality of line features 506 following the formation of metal fill 510 less is than 20%, or less than 10%, or less than 5%, or less than 2%, or less than 1%. In accordance with additional examples, the feature bending is less than 5 nm, 3.5 nm, 3 nm, or 2 nm for features having an aspect ratio as noted herein. Without the treatment, the feature bending for the otherwise same deposition conditions can be greater than 30% or greater than 40%.

Figure 6:
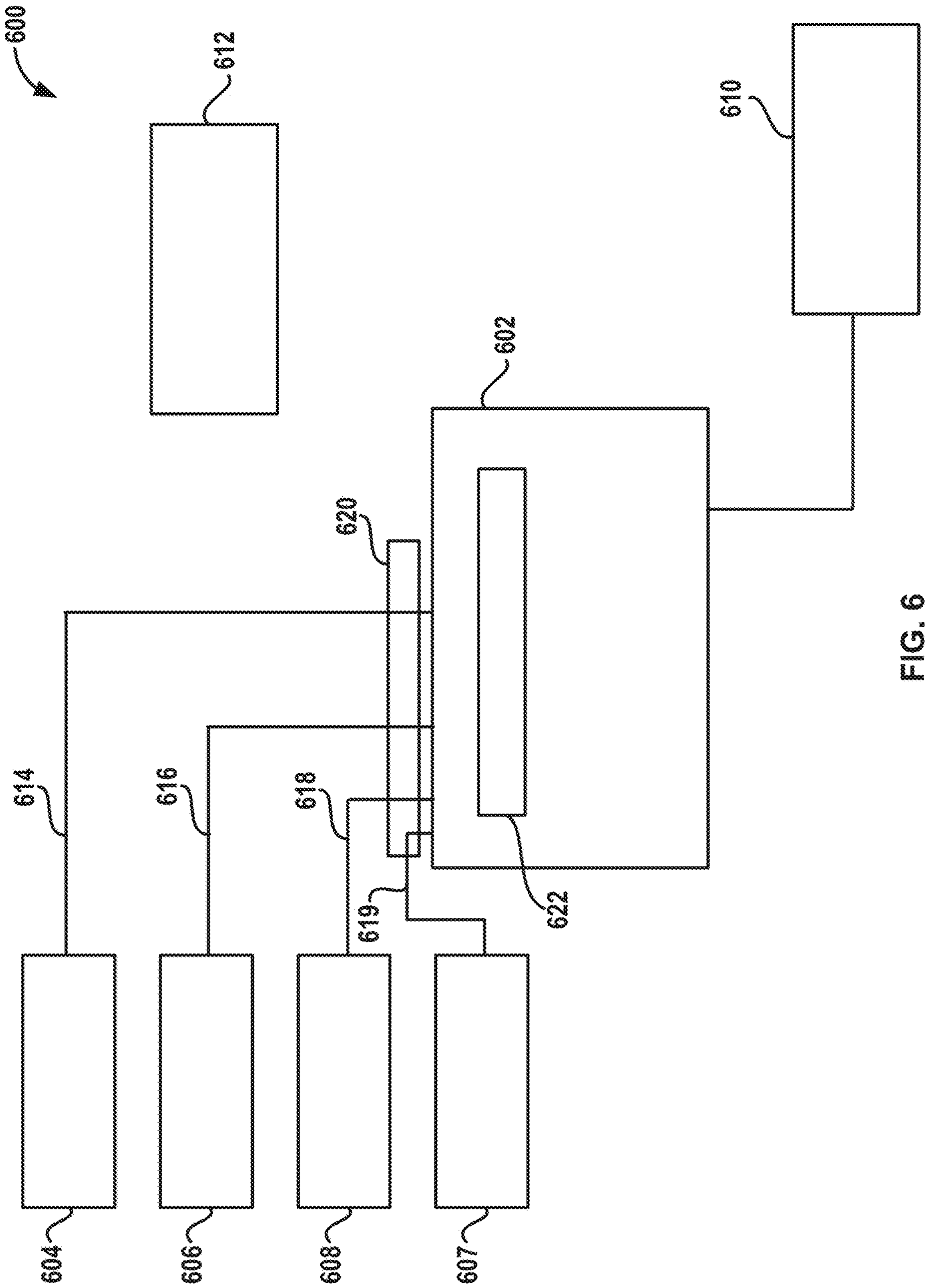
FIG. 6 illustrates a reactor system in accordance with additional exemplary embodiments of the disclosure.

FIG. 6 illustrates a system 600 in accordance with yet additional exemplary embodiments of the disclosure. System 600 can be used to perform a method or process as described herein and/or form a structure or device portion as described herein.

In the illustrated example, system 600 includes one or more reaction chambers 602, a precursor gas source 604, a reactant gas source 606, a nitrogen-containing reactant source 607, a purge gas source 608, an exhaust source 610, and a controller 612.

Reaction chamber 602 can include any suitable reaction chamber, such as an ALD or CVD reaction chamber.

Precursor gas source 604 can include a vessel and one or more molybdenum, tungsten, and ruthenium precursors as described herein—alone or mixed with one or more carrier (e.g., inert) gases (e.g., nitrogen, which can be or can include the nitrogen-containing reactant). Reactant gas source 606 can include a vessel and one or more reactants as described herein—alone or mixed with one or more carrier gases. Nitrogen-containing reactant source 607 can include one or more nitrogen-containing reactants—alone or mixed with one or more carrier gases. Purge gas source 608 can include one or more inert gases as described herein. Although illustrated with four gas sources 604, 606, 607, and 608, system 600 can include any suitable number of gas sources. For example, system 600 can include another transition metal precursor source. Gas sources 604, 606, 607, and 608 can be coupled to reaction chamber 602 via lines 614, 616, 618, and 619, which can each include flow controllers, valves, heaters, and the like.

Exhaust source 610 can include one or more vacuum pumps.

Controller 612 includes electronic circuitry and software to selectively operate valves, manifolds, heaters, pumps and other components included in system 600. Such circuitry and components operate to introduce precursors, reactants, and purge gases from the respective sources 604, 606, 607, and 608. Controller 612 can control timing of gas pulse sequences, temperature of the substrate and/or reaction chamber, pressure within the reaction chamber, and various other operations to provide proper operation of system 600. Controller 612 can include control software to electrically or pneumatically control valves to control flow of precursors, reactants and purge gases into and out of reaction chamber 602. Controller 612 can include modules, such as a software or hardware component, e.g., a FPGA or ASIC, which performs certain tasks. A module can advantageously be configured to reside on the addressable storage medium of the control system and be configured to execute one or more processes.

System 600 can include one or more remote excitation sources 620 and/or direct or indirect excitation sources 622, such as remote and/or direct and/or indirect plasma generation apparatus.

Other configurations of system 600 are possible, including different numbers and kinds of precursor and reactant sources and purge gas sources. Further, it will be appreciated that there are many arrangements of valves, conduits, precursor sources, and purge gas sources that may be used to accomplish the goal of selectively feeding gases into reaction chamber 602. Further, as a schematic representation of a system, many components have been omitted for simplicity of illustration, and such components may include, for example, various valves, manifolds, purifiers, heaters, containers, vents, and/or bypasses.

During operation of reactor system 600, substrates, such as semiconductor wafers (not illustrated), are transferred from, e.g., a substrate handling system to reaction chamber 602. Once substrate(s) are transferred to reaction chamber 602, one or more gases from gas sources 604, 606, 607, and 608, such as precursors, reactants, carrier gases, and/or purge gases, are introduced into reaction chamber 602.

The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

What is claimed is:

1. A method to reduce bending of features on a surface of a substrate, the method comprising the steps of:

providing a substrate within a reaction chamber, the substrate comprising a plurality of features, wherein at least two features of the plurality of features are adjacent features;

using a cyclic deposition process, forming a layer comprising one or more of molybdenum, tungsten, and ruthenium;

providing a nitrogen-containing reactant to the reaction chamber to form a transient surface species;

repeating the step of using the cyclic deposition process; and repeating the step of providing the nitrogen-containing reactant after the step of repeating the step of using the cyclic deposition process.

2. The method of claim 1, wherein the cyclic deposition process comprises:

providing a metal precursor comprising one or more of molybdenum, tungsten, and ruthenium to the reaction chamber; and providing a reducing reactant to the reaction chamber.

3. The method of claim 2, wherein a duration of the step of providing the metal precursor is greater than zero seconds and less than one second.

4. The method of claim 2, wherein a duration of the step of providing the reducing reactant is greater than zero seconds and less than 30 seconds or between about one second and about three seconds, or between about two seconds and about four seconds.

5. The method of claim 2, wherein the steps of providing the metal precursor and providing the reducing reactant are repeated two or more times prior to the step of providing the nitrogen-containing reactant to the reaction chamber.

6. The method of claim 1, further comprising a step of forming a nucleation layer.

7. The method of claim 6, wherein the nucleation layer comprises one or more of a molybdenum nitride, a tungsten nitride, and a ruthenium nitride.

8. The method of claim 6, wherein a thickness of the nucleation layer is greater than zero and less than 30 Angstroms.

9. The method of claim 6, wherein the step of forming the nucleation layer is a thermal process.

10. The method of claim 6, wherein a temperature of the substrate during the step of forming the nucleation layer is less than at least one of 450° C., 400° C., or 300° C.

11. The method of claim 6, wherein a temperature of the substrate during the cyclic deposition process is higher than a temperature during the step of forming the nucleation layer.

12. The method of claim 1, wherein the cyclic deposition process is a thermal process.

13. The method of claim 1, wherein a temperature of the substrate during the cyclic deposition process is between about 500° C. and about 600° C.

14. The method of claim 1, wherein the steps of using the cyclic deposition process and providing the nitrogen-containing reactant are repeated to fill a gap between the adjacent features.

15. The method of claim 1, wherein the nitrogen-containing reactant comprises one or more of nitrogen ($N_2$), ammonia ($NH_3$), hydrazine ($N_2H_4$), and an alkyl hydrazine derivative, in any combination.

16. A method to reduce bending of features on a surface of a substrate, the method comprising the steps of:

providing a substrate within a reaction chamber, the substrate comprising a plurality of features, wherein at least two features of the plurality of features are adjacent features;

using a cyclic deposition process, forming a layer comprising one or more of molybdenum, tungsten, and ruthenium;

providing a nitrogen-containing reactant to the reaction chamber to form a transient surface species;

repeating the step of using the cyclic deposition process; and forming activated species from the nitrogen-containing reactant.

17. The method of claim 16, further comprising a step of forming a nucleation layer.

18. A method to reduce bending of features on a surface of a substrate, the method comprising the steps of:

providing a substrate within a reaction chamber, the substrate comprising a plurality of features, wherein at least two features of the plurality of features are adjacent features;

forming a nucleation layer at a first substrate temperature;

forming a layer comprising one or more of molybdenum, tungsten, and ruthenium at a second substrate temperature;

providing a nitrogen-containing reactant to the reaction chamber to form a transient surface species; and repeating the steps of using the cyclic deposition process and providing the nitrogen- containing reactant, wherein the first substrate temperature is lower than the second substrate temperature.

19. The method of claim 18, wherein the steps of forming the nucleation layer and forming the layer comprising one or more of molybdenum, tungsten, and ruthenium are thermal processes.

20. The method of claim 18, further comprising a step of forming a nucleation layer.

* * * * *